(12) United States Patent
Araujo et al.

(10) Patent No.: US 9,759,322 B2
(45) Date of Patent: Sep. 12, 2017

(54) SLIDING ELEMENT FOR USE IN INTERNAL COMBUSTION ENGINE

(71) Applicants: MAHLE Metal Leve S.A., Jundiaí (BR); MAHLE International GmbH, Stuttgart (DE)

(72) Inventors: Juliano A. Araujo, Jundiai (BR); Nuno Costa, Mealhada (PT)

(73) Assignees: MAHLE Metal Leve S.A., Jundiai (BR); MAHLE International GmbH, Stuttgart (DE)

( * ) Notice: Subject to any disclaimer, the term of this patent is extended or adjusted under 35 U.S.C. 154(b) by 553 days.

(21) Appl. No.: 14/379,286

(22) PCT Filed: Feb. 15, 2013

(86) PCT No.: PCT/BR2013/000044
§ 371 (c)(1),
(2) Date: Aug. 15, 2014

(87) PCT Pub. No.: WO2013/120157
PCT Pub. Date: Aug. 22, 2013

(65) Prior Publication Data
US 2015/0018254 A1    Jan. 15, 2015

(30) Foreign Application Priority Data
Feb. 16, 2012    (BR) ............................ 102012003607

(51) Int. Cl.
*F16C 33/04*    (2006.01)
*B32B 7/02*    (2006.01)
(Continued)

(52) U.S. Cl.
CPC ............... *F16J 9/26* (2013.01); *C23C 28/322* (2013.01); *C23C 28/341* (2013.01);
(Continued)

(58) Field of Classification Search
CPC ............ C10M 2201/041; C23C 30/005; C23C 16/26; C08J 7/047
(Continued)

(56) References Cited

U.S. PATENT DOCUMENTS 6,599,400 B2 * 7/2003 Strondl ................. C23C 14/025
134/1.1
2007/0078067 A1    4/2007 Nakagawa et al.
(Continued)

FOREIGN PATENT DOCUMENTS

DE    102006002034 A1    7/2007
DE    102008042747 A1    4/2010
(Continued)

OTHER PUBLICATIONS

European Patent Office, Communication pursuant to Article 94(3) EPC for Application No. 13708068.5, Jul. 15, 2016, 5 pages, Netherlands.
(Continued)

*Primary Examiner* — Vishal Vasisth
(74) *Attorney, Agent, or Firm* — Alston & Bird LLP (57) ABSTRACT

A sliding element for use in an internal combustion engine may include a ferrous base having a peripheral sliding surface covered by a protective surface layer, the protective surface layer including at least one nitride applied via at least one of physical vapour deposition and a nitrided layer. The peripheral sliding surface may have a diamond like carbon (DLC) coating disposed thereon. The coating may include at least one of (a) one or more transition layers composed of WC1-x and (b) an adhesive layer of metallic chromium with a crystal structure. The coating may include an intermediate layer of metal DLC, the metal may be tungsten in a multilayer structure of a-C:H:W and a-C:H, and an outer layer of metal-free DLC.

20 Claims, 3 Drawing Sheets

(51) Int. Cl.
  *G11B 5/64* (2006.01)
  *B32B 9/00* (2006.01)
  *F16J 9/26* (2006.01)
  *C23C 28/00* (2006.01)

(52) U.S. Cl.
  CPC ............ *C23C 28/343* (2013.01); *C23C 28/42* (2013.01); *C10N 2280/00* (2013.01)

(58) Field of Classification Search
  USPC .................. 508/105; 428/216, 336, 408, 698
  See application file for complete search history.

(56) References Cited

U.S. PATENT DOCUMENTS

| | | |
|---|---|---|
| 2009/0202790 A1 | 8/2009 | Eerden et al. |
| 2011/0268946 A1 | 11/2011 | Fischer et al. |
| 2012/0205875 A1 | 8/2012 | Kennedy et al. |
| 2013/0004756 A1 | 1/2013 | Kennedy et al. |
| 2013/0042845 A1 | 2/2013 | Kennedy et al. |
| 2013/0136861 A1 | 5/2013 | Barenreuter et al. |
| 2013/0168906 A1 | 7/2013 | Kennedy et al. |

FOREIGN PATENT DOCUMENTS

| | | |
|---|---|---|
| DE | 102009046281 B3 | 11/2010 |
| DE | 102009028504 B3 | 1/2011 |
| DE | 102010002686 A1 | 9/2011 |
| DE | 102010002687 A1 | 9/2011 |
| DE | 102010002688 A1 | 9/2011 |
| JP | 2004-010923 A | 1/2004 |
| WO | WO-2010017984 A1 | 2/2010 |

OTHER PUBLICATIONS

International Searching Authority, Written Opinion for International Application No. PCT/BR2013/00044, Jun. 25, 2013, 6 pages, European Patent Office, Netherlands.

State Intellectual Property Office of the P.R.C., First Office Action for Application No. 201380020095.7, Nov. 3, 2015, 15 page, China.

State Intellectual Property Office of the P.R.C., Search Report for Application No. 201380020095.7, Oct. 22, 2015, 1 page, China.

State Intellectual Property Office of the P.R.C., Second Office Action for Application No. 201380020095.7, Jul. 1, 2016, 16 page, China.

* cited by examiner

Fig. 3
Cut A-A

SLIDING ELEMENT FOR USE IN INTERNAL COMBUSTION ENGINE

CROSS REFERENCE TO RELATED APPLICATIONS

This application is a US National Phase Application of PCT/BR2013/000044, filed on Feb. 15, 2013, which claims priority to Brazilian Patent Application No. BR-1020012003607-0, filed on Feb. 16, 2012,the contents of which are both hereby incorporated by reference in their entirety.

TECHNICAL FIELD

The present invention relates to a sliding member for use in internal combustion engines, for example, a piston ring, provided with a coating comprising from the inside to the outside an adhesive layer of a metal such as chromium metal (BCC-Cr) or a necessary or desirable equivalent, at least one transition layer consisting of a ceramic material such as tungsten carbide ($WC_{1-x}$), a metal DLC layer of especially tungsten and a metal-free DLC layer or the like and having a total thickness not less than 4 µm and not more than 15 µm.

BACKGROUND

In the present coating, the ratio between the thickness of the metal-free DLC layer and the metal layer is greater than 4 and/or of the thickness ratio of the overall layer by the thickness of the outer layer (a-C:H) is greater than 1, preferably between 1 and 1.4. The adhesive layer should preferably be chromium. The metal DLC layer designated as a-C:H:Me and, in this case, the metal is preferably tungsten termed as a-C:H:W, this layer has a multilayer structure comprising a-C:H layers and a-C:H:W layers.

The tungsten promotes excellent adhesion between the DLC layers and functions as an intermediate layer gradually changing the internal stress minimizing an abrupt change of the internal stress of the base material (internal low stress) to the DLC (high internal stress), additionally having a high chemical inertness and low wear. The outermost or top layer presents an amorphous structure containing carbon and hydrogen and can be called a-C:H.

Due to the aforementioned constitutions, especially beneficial properties with regard to friction and wear were achieved. These typical properties have been influenced by a thicker top layer. When compared to the average thickness layers, it has lower friction and greater durability. Particularly good friction values were observed when the outermost layer (a-C:H) had a thickness greater than the DLC layer containing metal, so that the thickness ratio of both is close to 5, preferably greater than 4, and the thickness ratio of the total layer with the thickness of the outer layer (a-C:H) is greater than 1, preferably between 1 and 1.4.

This configuration allowed solving two problems, the friction reduction and durability of the DLC layers. As an explanation for this behavior, it was discovered that the metal-free DLC layer and the general coating generate high stress in the system as a whole, which can be reduced with the correct combination of the thickness of the metal layer and the outermost layer, and of the configuration of intermediate layers of chromium and tungsten carbide ($WC_{1-x}$), so that a coating having an improved combination of wear resistance and low friction is obtained.

Thus, one obtains a piston ring with proper durability and low friction. It is known that metal-free DLC has a higher wear resistance and low friction. However it is not possible to produce a thick coating of metal-free DLC because of high internal stresses of this coating and, with the configuration proposed in this document, it was possible to build up a thick layer of metal-free DLC without it being weakened by high stresses, with a ratio between the layer thickness of metal-free DLC layer and the metal layer of >4 and/or of the thickness ratio of the total layer with the thickness of the outer layer (a-C:H) is greater than 1, preferably between 1 and 1.4, which yields the piston ring a longer life and lower friction than that secured by an outermost DLC layer, which guarantees a low wear resistance with a low lifetime exposing the metal DLC layer at the start of operation of the engine, such that this layer has friction higher than that of the metal-free DLC layer. The sliding element thus configured has advantages such as increased stability and durability, giving the internal combustion engine equipped with it a large commercial service life and low friction.

In contrast, if coating is formed in a layer thickness ratio between the metal-free DLC layer and the metal DLC layer of <4 and/or the ratio with the total thickness with the thickness of the outer layer (a-C:H) is <1, the residual stresses will not be compensated. This leads to premature wear of the DLC layer as a whole, despite the large thickness of the outermost layer or a peeling of the DLC layer due to high loads (contact pressure) during operation.

Recent and extensive studies conducted by the applicant have confirmed that, regardless of thickness substantially between 4 µm and 15 µm, the present coating results in interesting and advantageous properties of wear resistance and durability.

For an internal combustion engine to function reliably and in accordance with the parameters devised by its designers, it is necessary that its internal components have high durability even under the most critical operating conditions.

In order to ensure the durability of an engine and an efficient yield, components such as piston rings and bearings, among others, must provide resistance to wear originated from constant sliding, high temperatures and chemical and abrasive attack from products of combustion occurring within the cylinders, and thereby receive coatings to better withstand the endless cycles of engine operation. In addition, this coating should have low friction since friction losses in a combustion engine represent up to 15% of energy and consequent higher fuel consumption and higher emissions of polluting gases.

The improvement of coatings applied to these components is constant, having as premises the base material that the component is made of, the operating parameters of the engine, the manufacturing costs, etc.

Specifically with respect to piston rings, some coatings were developed aiming to give these components high durability and low friction.

A first coating is disclosed in document DE 10 2009 046 281, which relates to a piston ring made of steel or cast iron provided with a coating consisting of a metal-free DLC layer or comprising an inner metal layer and a metal-free top layer, a chromium nitride (CrN) layer deposited by the PVD process ("Physical Vapour Deposition") and a ceramic intermediate layer of $Me(C_xN_y)$.

The nitrided layer is applied to the ring base and over it, subsequently, the aforementioned intermediate layer is applied. Finally, the DLC coating is applied over the intermediate layer.

As an option (not required) an adhesive layer is provided which makes the connection between the chromium nitride layer applied by PVD and the base of the piston ring or the like.

A vulnerability of this coating lies in the fact that the Me (CxNy) link layer is fragile and brittle and can lead to premature detachment of the coating, resulting in a lower lifetime of the internal combustion engine, which is undesirable in terms of market.

Moreover, contrary to the proposed coating, this prior art coating has no transition layer comprising tungsten carbide WC1-x, making it, therefore, quite different.

Document DE 10 2008 042 747 discloses a sliding element such as a piston ring whose coating comprises an adhesive layer consisting of metal chromium applied onto the substrate, a nitride layer (CrN) applied by the PVD process (Physical Vapour Deposition), an internal layer provided with carbon that has greater hardness and/or contains a small percentage of hydrogen relative to a carbon layer provided outside preferably of the type a-C:H.

The disadvantage of this second coating lies in the fact that hydrogen favors the formation of the sp3 electronic structure (same structure of diamond) and with its reduction there will be an increase of the sp2 structure (same structure of graphite). With this, the wear resistance of the coating is impaired.

Moreover, as the crucial difference related to the coating developed herein by the applicant, this prior art coating has, as the great advantage, the second layer, counted from the outside inwards, which has the form of amorphous carbon instead of the novel multilayer structure (a-C:H: W) and (a-C:H). Due to this formation, the indices of performance achieved by this coating are lower, especially in the resistance to crack propagation.

Document DE 10 2009 028 504, in turn, discloses a piston ring manufactured in steel or cast iron initially coated with an adhesive layer to which is applied an intermediate layer containing carbon and a metal (especially Tungsten) and a DLC layer without the occurrence of a metallic component. The average thickness of this coating is 5 µm to 40 µm, the ratio between the thicknesses of the outer layer and the intermediate layer is 0.7 to 1.5 and the ratio between the thicknesses of the outer layer and the total thickness of the coating is about 0.4 to 0.6.

As the big difference relative to the coating developed herein, this prior art does not show any middle layer configured on multilayer structure (W-C:H) and (a-C:H). In fact, this layer is absent from this coating and, thus, the indices of performance achieved by this coating are low, especially in the resistance to crack propagation. Additionally, the thickness of the metal-free DLC coating, which is the layer that provides lower friction, has a thickness lower than the total coating.

Finally, document US 2007/0078067 discloses a coating applied to at least one sliding member characterized in that it comprises a film of amorphous carbon on the surface of the sliding member and has a D band (associated with the disorder of the sp2 carbon) to G band (monocrystalline graphite) integrated intensity ratio in the Raman spectrum between 1.5 and 2.0.

The coatings discussed above have properties which make them unsatisfactory for use in engine components, since they cannot display, simultaneously, high wear resistance and suitable toughness for working within an internal combustion engine.

The present coating, developed by the applicant, after many studies and researches, is new and inventive activity over the others, and offers significant advantages such as easy deposition, excellent mechanical properties and competitive application cost, high wear resistance and toughness compatible with the demands of the new engines and low friction aligned with the demands of emissions from internal combustion engines.

The present coating may be applied to any sliding elements used in an internal combustion engine as piston rings, bearing shells, bearings, bushings, etc., while they have a ferrous base.

SUMMARY

The object of the present invention is to provide a sliding element for use in an internal combustion engine having a DLC type coating with a thickness of not less than 4 µm and not more than 15 µm, whose process results in the application of an innovative, new and inventive coating in light of other currently known coatings, and which presents several advantages for use, such as easy deposition, excellent mechanical and structural properties mainly it enables the production of an a-C:H thick layer while maintaining satisfactory levels of toughness and high durability.

The objects of the present invention are achieved by a sliding element for use in internal combustion engines, provided with a ferrous base covered by a protective surface layer comprising at least one nitride applied by physical vapour deposition process (PVD) or a nitrided layer, to which peripheral sliding surface a diamond like carbon (DLC) coating is applied, wherein:
(i) coating comprises at least one transition or adhesion layer comprising WC1-x and/or a layer of metallic chromium with a crystal structure (BCC—"body cubic center") positioned between the piston ring and the metal DLC layer, especially tungsten in a multilayer structure (a-C:H:W) and (a-C:H) as an intermediate layer and an outer metal-free DLC layer; and
(ii) the ratio between the thickness of the metal-free DLC layer and the metal layer is greater than 4 and/or of the thickness ratio of the total layer by the thickness of the outer layer (a-C:H) is greater than 1, preferably between 1 and 1.4.

Also, the objects of the present invention are achieved by a sliding element for use in internal combustion engines, provided with a ferrous base, to which peripheral sliding surface a diamond like carbon (DLC) coating is applied, wherein:
(i) coating comprises, taken from the outer portion towards the ferrous base, an outer amorphous layer of the (a-C:H) type, an intermediate layer corresponding to a nanocrystalline phase of carbides in (a-C:H:W) and (a-c:H) multilayer structures and a transition layer comprising WC1-x, and a layer of metallic chromium with a crystal structure (BCC—body cubic center) and a protective layer composed of at least one nitride applied by the physical vapor deposition process (PVD);
(ii) the ratio between the thickness of the metal-free DLC layer and the metal layer is greater than 4 and/or of the thickness ratio of the total layer by the thickness of the outer layer (a-C:H) is greater than 1, preferably between 1 and 1.4; and
(iii) the D band (associated with the disorder of the sp2 carbon) to G band (monocrystalline graphite) integrated intensity ratio in the Raman spectrum is between 0.2 and 1.0.

BRIEF DESCRIPTION OF THE DRAWINGS

The present invention will be further described in more details based on one example of execution represented in the drawings. The figures show.

DETAILED DESCRIPTION

Figure 1:
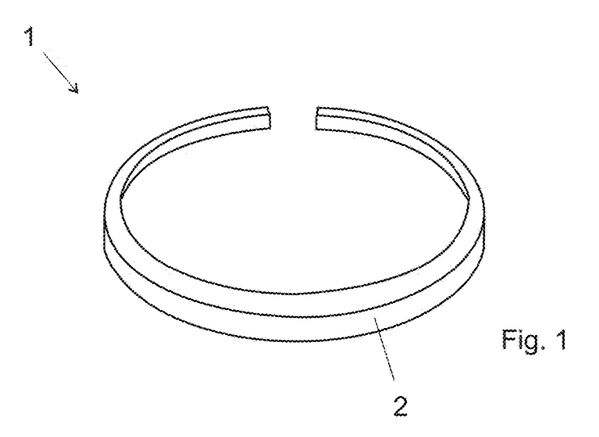
FIG. 1—is a perspective view of a representation of a preferred embodiment of the sliding member, object of the present invention, in the shape of a piston ring.
Figure 2:
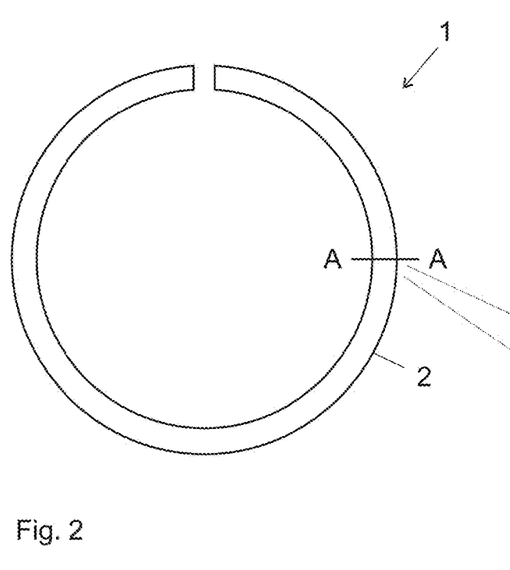
FIG. 2—represents a top view of the piston ring illustrated in FIG. 1.
Figure 3:
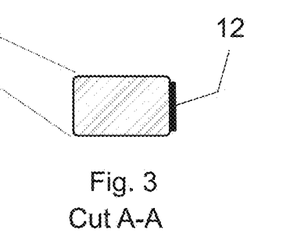
FIG. 3—is a schematic cross-sectional view of the ring piston shown in FIG. 2 according to section A-A, where one can see, schematically, the coating applied to its peripheral sliding surface.

According to a preferred embodiment and, as can be seen from FIG. 1, the present invention relates to a sliding element 1 for use in internal combustion engines, having a ferrous base 10, to which peripheral sliding surface 2 a diamond like carbon (DLC) coating 12 is applied.

The present coating, developed by the applicant is new and inventive activity over others currently existing, as will be explained later, and has significant advantages, such as easy deposition, excellent mechanical and structural properties and competitive application cost.

Initially, it should be noted that, preferably, the first sliding element 1 is a piston ring, but it may take any other necessary or desirable constitution such as a bearing, a bearing shell, a bushing, or any other element.

Although preliminary, it should be noted that the first sliding element, object of the present invention, has the coating applied at least to its outer sliding surface 2, but nothing prevents the coating to be applied further to other parts and surfaces of the element, if deemed necessary or desirable.

When element 1 has a preferable constitution of a piston ring, the present coating 12 is applied at least to the outer surface 2, which is the one that touches the cylinder wall, against which the ring slides as the piston performs its reciprocating movement.

However, nothing prevents other parts of the ring, as for example, top, bottom and inner surfaces which friction against the respective annular cavity existing in the piston, to also receive the present coating.

Describing in an conceptual manner, the sliding element 1 is provided with a ferrous base 10 covered by a protective surface layer 11 comprising chromium nitride applied by the physical vapour deposition process (PVD), also known as ion plating and/or a nitrided layer. As mentioned above, a coating 12 of DLC-type carbon is applied on the sliding peripheral surface 2, which comprises at least one transition layer 122 comprising WC1-x and a layer of metallic chromium with a crystal structure (BCC—body cubic center) 121 positioned between the ferrous base 10 and the outer layer of amorphous carbon 124. A schematic illustration of the coating, with the layers clearly illustrated, can be seen in FIG. 4.

Figure 4:
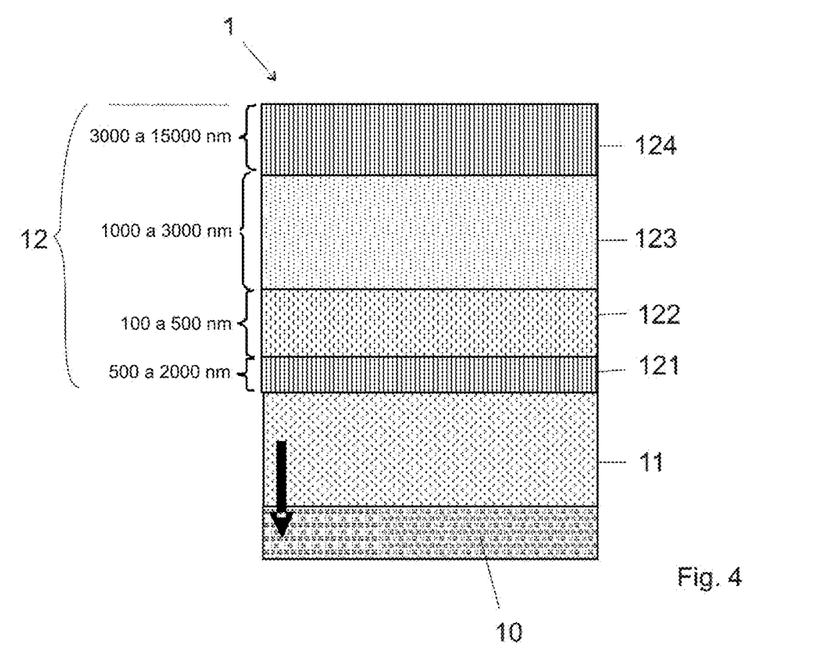
FIG. 4—is a detailed view showing a preferred variation of the coating applied to the peripheral sliding surface of the sliding member object of the present invention.

The ferrous base 10 can have many different constitutions, but preferably, it comprises a carbon steel substrate, cast iron or stainless steel (the latter preferably containing 17% chromium—Cr).

The aforesaid protective surface layer 11 is applied this ferrous base, and this layer which comprises at least one nitride (preferably, chromium nitride), by the PVD process. The chromium nitride, preferably, has the preponderant formation of CrN but clearly one may use preponderantly the Cr2N, if necessary or desirable. Further, alternatively, it is conceivable to use a nitrided layer.

The application of a nitrided layer 11 or CrN coating, according to the PVD process, over a ferrous substrate 10 is quite known to those skilled in the art, and therefore the novelty of coating 12 developed by the applicant lies in the layers applied over the nitrided layer and/or CrN.

Thus, starting the description of the innovative aspects of the present invention, and taking the description of the composition of the layers applied from the base towards the exterior, over the nitrided layer it is applied coating 12 of diamond like carbon (DLC), which comprises the adhesive metal layer 121, the transition layer comprising WC1-x 122, the intermediate layer 123 comprising a nanocrystalline structure of carbides in a multilayer structure (a-C:H:W) and (a-C:H) and, finally, the outer layer 124 of amorphous-type carbon (a-C:H).

The adhesive metal layer 121 is preferably a layer of metallic chromium with the already mentioned crystal structure (BCC—body cubic center). Also preferably, but not mandatory, the thickness of the adhesive layer is about 500 nm to 2,000 nm.

The primary function of adhesive layer 121, according to its name, is to increase the adhesion of the layers that are deposited over it in relation to the nitrided layer 11 applied over the ferrous base 10, ensuring the cohesion of coating 12 as a whole, avoiding spalling and the accumulation of stress, phenomena which, when occurring, reduce the lifetime of sliding element 1.

The transition layer 122 comprising WC1-x is applied over the adhesive layer 121 and comprises tungsten carbide (which, in turn, comprises the chemical elements tungsten and carbon in variable proportion). Composition WC1-x means that if x=zero, the ratio is one atom of carbon (C) for one atom of tungsten (W). By analogy, if, for example, x=0.5, it means that there are two atoms of tungsten for one atom of carbon.

If necessary or desirable, metal tungsten may be replaced by other metallic elements.

Intermediate layer 123, which, as already mentioned, is composed of a carbide nanocrystalline structure in a multilayer structure having sub-layers (a-C:H:W) and (a-C:H) is applied over the transition layer 122, allowing for a later application of the amorphous carbon layer 124, format (a-C:H), which is the outermost coating layer 12. The outer layers 124 and 123 contain hydrogen.

Figure 5:
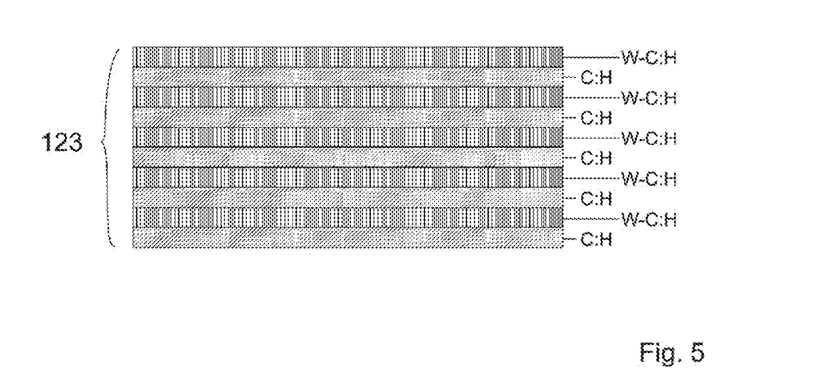
FIG. 5—is a detailed view showing an intermediate layer comprising (a-C:H:W) and (a-C:H) of the coating applied to the peripheral sliding surface of the sliding member which is the object of the present invention.
Figure 6:
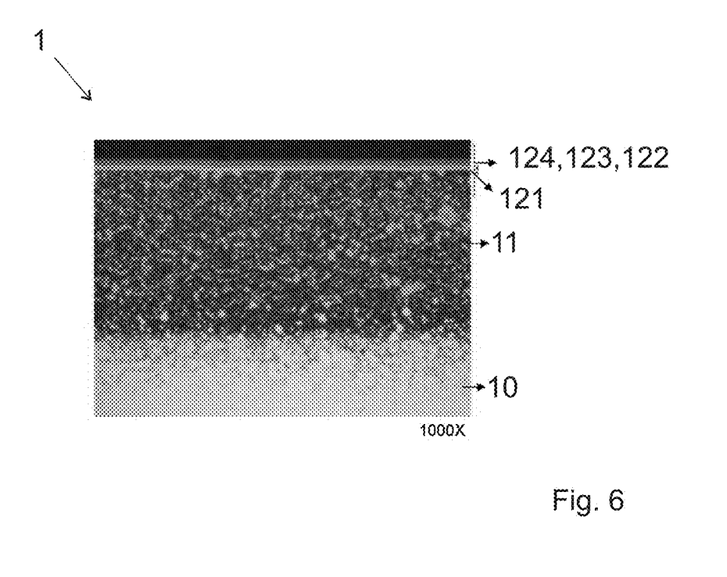
FIG. 6—is a photograph of the coating applied to the peripheral sliding surface of the sliding member which is the object of the present invention magnified 1,000×.

Sub-layers (a-C:H:W) and (a-C:H) are applied over one another, from the manipulation of the amount of tungsten existing at the time of application, in the equipment itself in which it is performed, forming the aforementioned multilayer structure as illustrated in FIG. 5. Such a constitution is considerably advantageous when compared to the existing coatings in which the intermediate layer is not configured as multilayer, since this multiple structure greatly diminishes the propagation of cracks. Although there is the beginning of a crack or break in one of the sub-layers (a-C:H:W) or (a-C:H), its growth or propagation is stopped at the moment when it reaches the immediately adjacent sub-layer, due to the fact it presents a structure sufficiently different in terms of dissipation/accumulation of stresses.

The characteristic presented by the intermediate layer 123 of the coating, object of the present invention, of preventing the propagation of cracks, allow for the sliding element of the engine, object of the present invention, to present a greater resistance to wear, thereby providing a longer life to the engine and, for this reason, being much more desirable.

The preferred thicknesses of the coating layers 12, object of the present invention, can be found in the table below, and may vary freely within the established ranges, without the resulting invention ceasing to be included in the scope of protection of the claims.

| Outer layer 124 | 3,000 nm to 13,000 nm |
| Intermediate layer 123 (multilayer) | 1,000 nm to 3,000 nm |
| Transition layer 122 | 100 nm to 500 nm |
| Adhesive layer 121 | 500 nm to 2,000 nm |

The variation in the thicknesses of the layers is used in order to maximize the coating properties and, therefore, the piston ring to which it has been applied, in view of its primary use (engine type, functioning/operating conditions, compression rate, fuel quality, etc).

Total coating 12 (the sum of all the layers above) has a thickness of 4 μm to 15 μm, more preferably between 8 μm and 12 μm. For values above 15 μm, there is a drop in the mechanical properties, thus making the coating less desirable.

It is also important to note that the variation in thickness of the layers can be made freely, but must respect the total thickness of 4 μm to 15 μm and, concomitantly, a thickness ratio between the metal-free DLC layer 124 and the metal layer 123 is greater than 4 and/or of the thickness ratio of the total layer by the thickness of the outer layer (a-C:H) 124 is greater than 1, preferably between 1 and 1.4.

These two ratio values ensure coating 12 mechanical properties of strength and toughness that make them plainly desirable when compared to coatings currently used.

As an explanation for this behavior, it was discovered that the metal-free DLC layer generates high stress in the system as a whole, which can be reduced with the correct combination of the thickness of the metal layer and the outermost layer, and of the configuration of intermediate layers of chromium and tungsten carbide (WC1-x), so that a coating having an improved combination of wear resistance and low friction is obtained. It is known that metal-free DLC has a higher wear resistance and lower friction due to high sp3 hybridization and its amorphous structure. But a difficulty of this coating is to produce it in a suitable thickness that leads to a satisfactory durability for applications in piston ring, since it is not possible to produce a thick coating of metal-free DLC due to the high internal stresses of this coating.

However, with the configuration proposed in the present document, it was possible to build up a thick metal-free DLC layer without it being weakened by high stresses. In contrast, in case a thickness ratio of the layer between the metal-free DLC layer and the metal layer is <4, and/or the thickness ratio of the total layer with the thickness of the outer layer (a-C:H) is <1, the residual stresses will not be compensated and the high durability of the metal-free DLC layer having less friction than the others will not be guaranteed. This leads to premature wear of the DLC layer as a whole.

Moreover, the hardness of coating 12 preferably assumes values between 1,800 HV and 3,000 HV.

Besides having a configuration not provided by any coating belonging to the prior art, coating 12 has a very desirable number of features and technical properties.

It is important to mention that in coating 12, object of the present invention, the integrated intensity ratio of the D band (associated with the disorder of the sp2 carbon) to the G band (monocrystalline graphite) in the Raman spectrum is between 0.2 and 1.0, which will be detailed below.

Raman spectroscopy is a technique that uses a source of monochromatic light which, when hitting an object, is scattered by it thus generating light of the same energy or different energy than the incident light. In the first case, the scattering is called elastic and is not of interest, but in the second (inelastic scattering) it is possible to obtain important information about the chemical composition of the object from this energy difference. The technique is possible due to the phenomenon whereby, when a molecule is irradiated, the energy can be transmitted, absorbed or scattered.

The Raman Effect can be explained by the inelastic collision between the incident photon and the molecule. This changes the vibrational and/or rotational energy levels of the molecule for a given increment and, according to the law of conservation of energy, this means that the energies of the incident and scattered photons are different.

The Raman spectrum is the wavelength of the scattered radiation relative to the excitation radiation (laser). Readings are taken in the visible and NIR (near infrared) regions.

Explaining in more detail, a beam of low power laser radiation is used to illuminate small areas of the object of interest and, on focusing on the defined area, it is scattered in all directions, with a small portion of this radiation being scattered inelastically, (with a frequency different from the incident→E=hv or E=h.c.$\lambda$−1).

The energy difference between the incident and scattered radiations corresponds to the energy with which atoms present in the studied area are vibrating and this vibration frequency allows discovering how atoms are bonded, having information on the molecular geometry, about how the present chemical species interact among themselves and with the environment, among other things.

With this, Raman spectroscopy allows differentiation of polymorphs, that is, substances having different structures and, thus, different properties, despite having the same chemical formula.

Since there is only one type of vibration, since usually the present chemical species are complex, the inelastically scattered radiation is composed of a very large number of different frequencies which need to be separated and have their intensity measured. The graph representing the intensity of scattered radiation as a function of its energy (given by means of a unit called 'wave number' and expressed in cm-1) is called the Raman spectrum. Each chemical species, be it a pigment, dye, substrate, binder, vehicle or varnish gives a spectrum which is like its fingerprint, thus permitting its unequivocal identification or, for example, the detection of chemical changes resulting from its interaction with other substances or with light.

Returning to the present coating, the Raman spectrum analysis makes it possible to define D and G bands (disorder of the sp2 carbon and monocrystalline graphite, respectively).

The Raman spectra of various forms of carbon are well known. The first order spectrum of diamond consists of a single peak at 1332 cm-1. The corresponding spectrum of monocrystalline graphite also shows a single peak (G peak) at 1580 cm-1 (associated with graphitic sp2 carbon). In polycrystalline graphite, besides peak G, the Raman spectrum shows another peak near 1350 cm-1 (D peak) (associated with the disorder of the sp2 carbon).

Thus, comparing the Raman spectrum of polycrystalline graphite with those obtained for the DLC films, one can investigate changes in the structure of graphite caused by the presence of metallic elements in the films.

The intensity ratio (ratio) between D and G bands (D/G) indicates the ratio of amorphous structure (outer layer 124) contained in the DLC coating. When this ratio value is higher (the proportion of the amorphous layer is higher), the amorphous structure tends to be transformed into graphite at the moment of sliding, which reduces the coefficient of friction and consequent wear, but wear resistance cannot be maintained due to the existing weakening points.

In the case of the present coating 12, the nanocrystalline structure of tungsten carbide is suitable for coatings which have amorphous carbon ratio D/G of 0.2 to 1.0 according to Raman spectrum analysis, so that the characteristics of low friction and wear resistance can be improved.

When the ratio D/G ratio is less than 0.2, the friction coefficient cannot be sufficiently reduced and, on the other hand, when D/G exceeds 1.00, the wear resistance cannot be maintained near interesting levels.

After one example of a preferred embodiment has been described, it should be understood that the scope of the present invention encompasses other possible embodiments and is limited only by the content of the appended claims, which include their possible equivalents.

The invention claimed is:

1. A sliding element for use in an internal combustion engine, comprising:
   a ferrous base having a peripheral sliding surface covered by a protective surface layer including at least one nitride applied via at least one of physical vapour deposition and a nitrided layer, the peripheral sliding surface having a diamond like carbon (DLC) coating disposed thereon,
   wherein:
   (i) the coating includes at least one of (a) one or more transition layers composed of WC1-x and (b) an adhesive layer of metallic chromium with a crystal structure, an intermediate layer of metal DLC, wherein the metal is tungsten in a multilayer structure of a-C:H:W and a-C:H, and an outer layer of metal-free DLC;
   (ii) a ratio between a thickness of the outer layer and the intermediate layer is between 4 and 5; and
   (iii) a thickness ratio of the total layers of the coating by a thickness of the outer layer is between 1 and 1.4.

2. The sliding element according to claim 1, wherein the outer layer includes hydrogen.

3. The sliding element according to claim 1, wherein the transition layer includes precipitated nanocrystalline tungsten carbide.

4. The sliding element according to claim 3, wherein at least one of the coating layers is completely amorphous.

5. The sliding element according to claim 3, wherein the transition layer has a thickness between 100 nm and 500 nm.

6. The sliding element according to claim 1, wherein at least one of the coating layers is completely amorphous.

7. The sliding element according to claim 1, wherein the transition layer has a thickness between 100 nm and 500 nm.

8. The sliding element according to claim 1, wherein the coating has a total thickness of 4 μm to 15 μm.

9. The sliding element according to claim 1, wherein the coating includes a hardness of 1,800 HV to 3,000 HV.

10. The sliding element according to claim 1, wherein the outer layer includes a structure of a-C:H.

11. The sliding element according to claim 1, wherein the coating has a total thickness of 8 μm to 12 μm.

12. A sliding element for an internal combustion engine, comprising:
    a ferrous base having a peripheral sliding surface of a diamond like carbon (DLC) coating disposed thereon,
    wherein:
    (i) the coating includes, from an outer portion towards the ferrous base, an amorphous outer layer having a structure of a-C:H, an intermediate layer including a nanocrystalline structure of carbides in a multilayer structure of a-C:H:W and a-C:H, a transition layer constituting WC1-x, a layer of metallic chromium with a crystal structure, and a protective layer composed of at least one nitride applied via physical vapor deposition;
    (ii) a ratio between a thickness of the amorphous outer layer and the intermediate layer is between 4 and 5;
    (iii) a thickness ratio of the total layers by a thickness of the outer layer is between 1 and 1.4; and
    (iv) the coating has an integrated intensity ratio in the Raman spectrum between D band to G band within a range of of 0.2 and 1.0.

13. The sliding element according to claim 12, wherein the transition layer includes precipitated nano crystalline tungsten carbide.

14. The sliding element according to claim 12, wherein at least one of the coating layers is completely amorphous.

15. The sliding element according to claim 12, wherein the transition layer has a thickness between 100 nm and 500 nm.

16. The sliding element according to claim 15, wherein the transition layer includes precipitated nano crystalline tungsten carbide.

17. The sliding element according to claim 16, wherein at least one of the coating layers is completely amorphous.

18. The sliding element according to claim 12, wherein the sliding element is a piston ring.

19. The sliding element according to claim 12, wherein the transition layer is deposited via a sputtering process.

20. A sliding element for an internal combustion engine, comprising:
    a ferrous base having a peripheral sliding surface including a diamond like carbon coating disposed thereon, the coating including:
    a protective layer disposed on the base composed of at least one nitride; a layer of metallic chromium with a crystal structure disposed on the protective layer;
    a transition layer composed of WC1-x disposed on the layer of metallic chromium, the transition layer including a thickness between 100 nm and 500 nm;
    an intermediate layer including a nanocrystalline structure of carbides in a multilayer structure of a-C:H:W and a-C:H disposed between the transition layer and an outer layer, the outer layer composed of amorphous carbine having a structure of a-C:H;
    wherein:
    (i) a ratio between a thickness of the amorphous outer layer and the intermediate layer is between 4 and 5,
    (ii) a thickness ratio of the total layers of the coating by a thickness of the outer layer is between 1 and 1.4, (iii) the coating has a thickness between 8 μm and 12 μm and a hardness of 1,800 HV to 3,000 HV; and
(iv) the coating has an integrated intensity ratio in the Raman spectrum between D band to G band within a range of 0.2 and 1.0.

\* \* \* \* \*